United States Patent [19]

Linker, Jr. et al.

[11] Patent Number: 4,686,637
[45] Date of Patent: Aug. 11, 1987

[54] APPARATUS AND METHOD FOR LEAD INTEGRITY DETERMINATION FOR DIP DEVICES

[75] Inventors: Frank V. Linker, Jr., Broomall, Pa.; Thomas E. Shuren, Stanhope, N.J.

[73] Assignee: American Tech Manufacturing, Inc., Glenolden, Pa.

[21] Appl. No.: 648,872

[22] Filed: Sep. 10, 1984

[51] Int. Cl.[4] .................... G01R 31/04; G06F 15/46
[52] U.S. Cl. ..................................... 364/550; 29/593; 324/73 R
[58] Field of Search ......... 364/550; 324/73 R, 73 PC, 324/158 F, 158 R; 356/237; 29/574, 741, 835, 836, 838, 593

[56] References Cited

U.S. PATENT DOCUMENTS

| 4,405,233 | 9/1983 | Grau | 324/73 K X |
| 4,446,481 | 5/1984 | Edamatsu et al. | 356/237 X |
| 4,463,310 | 7/1984 | Whitley | 324/73 PC |
| 4,485,548 | 12/1984 | Janisiewicz | 29/741 |

FOREIGN PATENT DOCUMENTS 0136888 10/1979 Japan .................... 356/237

Primary Examiner—Felix D. Gruber
Assistant Examiner—H. R. Herndon
Attorney, Agent, or Firm—Eugene E. Renz, Jr.

[57] ABSTRACT

An apparatus for determining lead integrity of DIP devices, wherein the leads of the DIP devices extend from a track for supporting the DIP devices during passage through the apparatus. Included is a transmitting means for the transmission of a signal, positioned so that the leads of the DIP devices traveling on the track intersect the transmitted signals and a receiving means for receiving and converting a transmitted signal to an electrical signal, positioned so that as the leads of the DIP device intersect said transmitted signal, the receiving means generates an electrical signal reflective of the intersection for determining the integrity of the leads based upon the electrical signal. The receiving means includes receptors positioned on either side of the track such that each receptor receives the transmitted signal intersected by the leads as the DIP devices travel on the track. The receptors are arranged wherein a first receptor is oriented upstream along the track and wherein at least two other receptors are oriented such that one is further than the other from the track in order to receive signals which interest the leads at at least two spaced points therein. Both other receptors are downstream in the direction of travel of the DIP devices.

26 Claims, 19 Drawing Figures

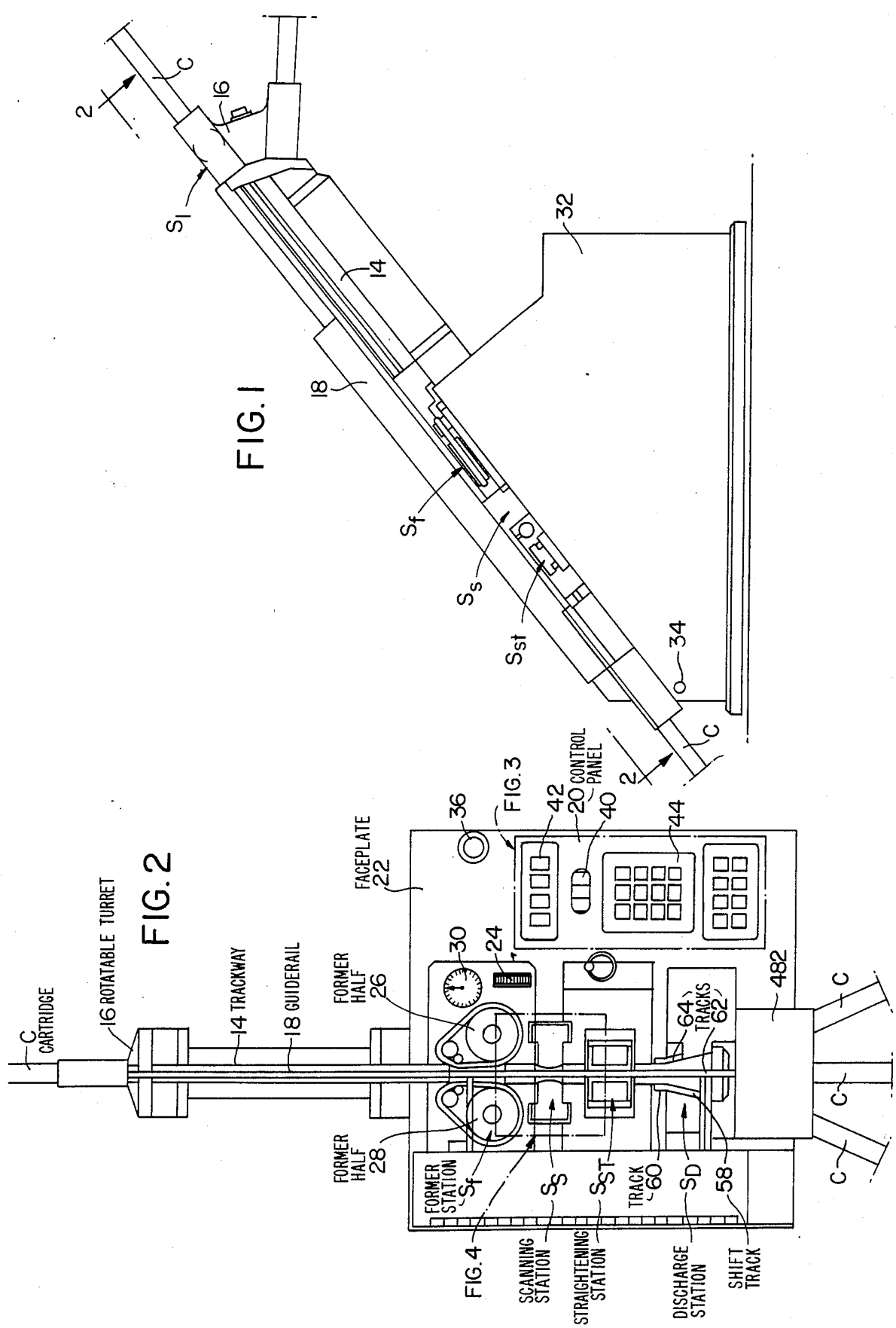

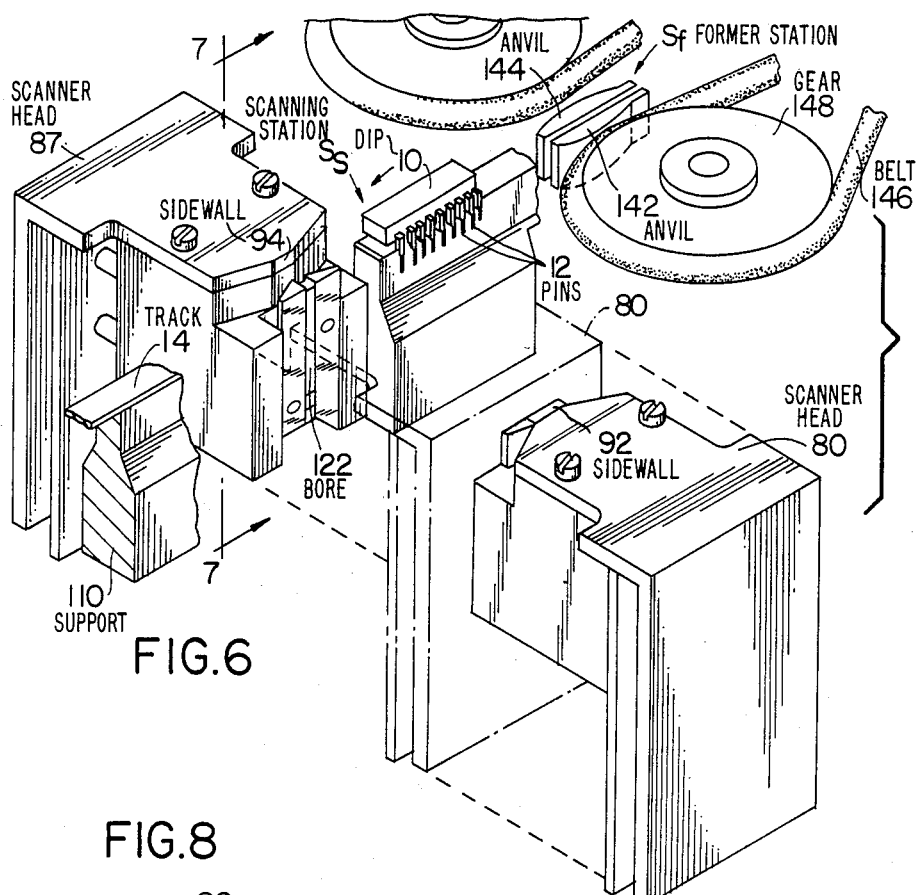
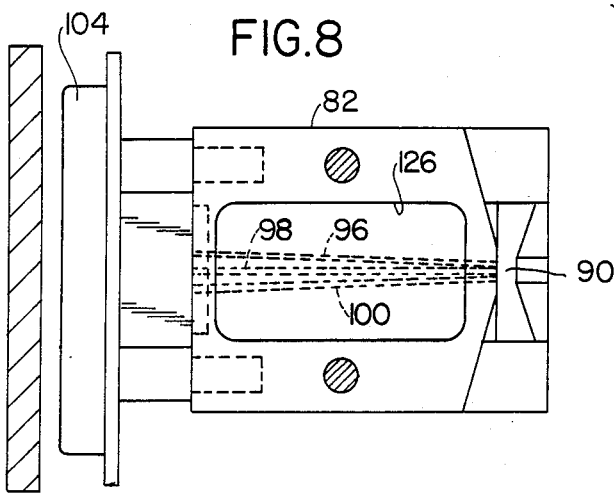
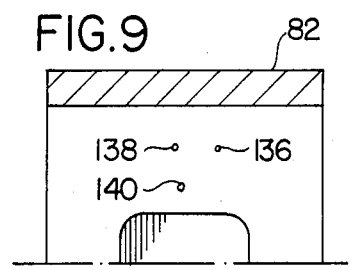
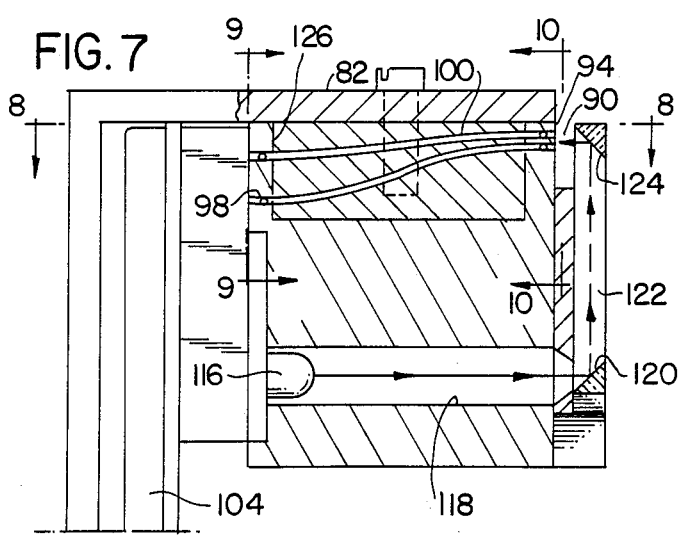
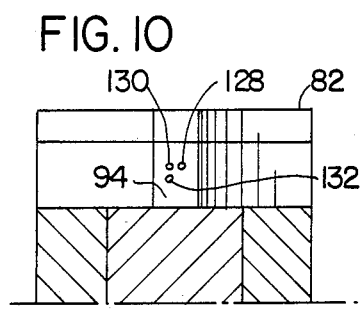

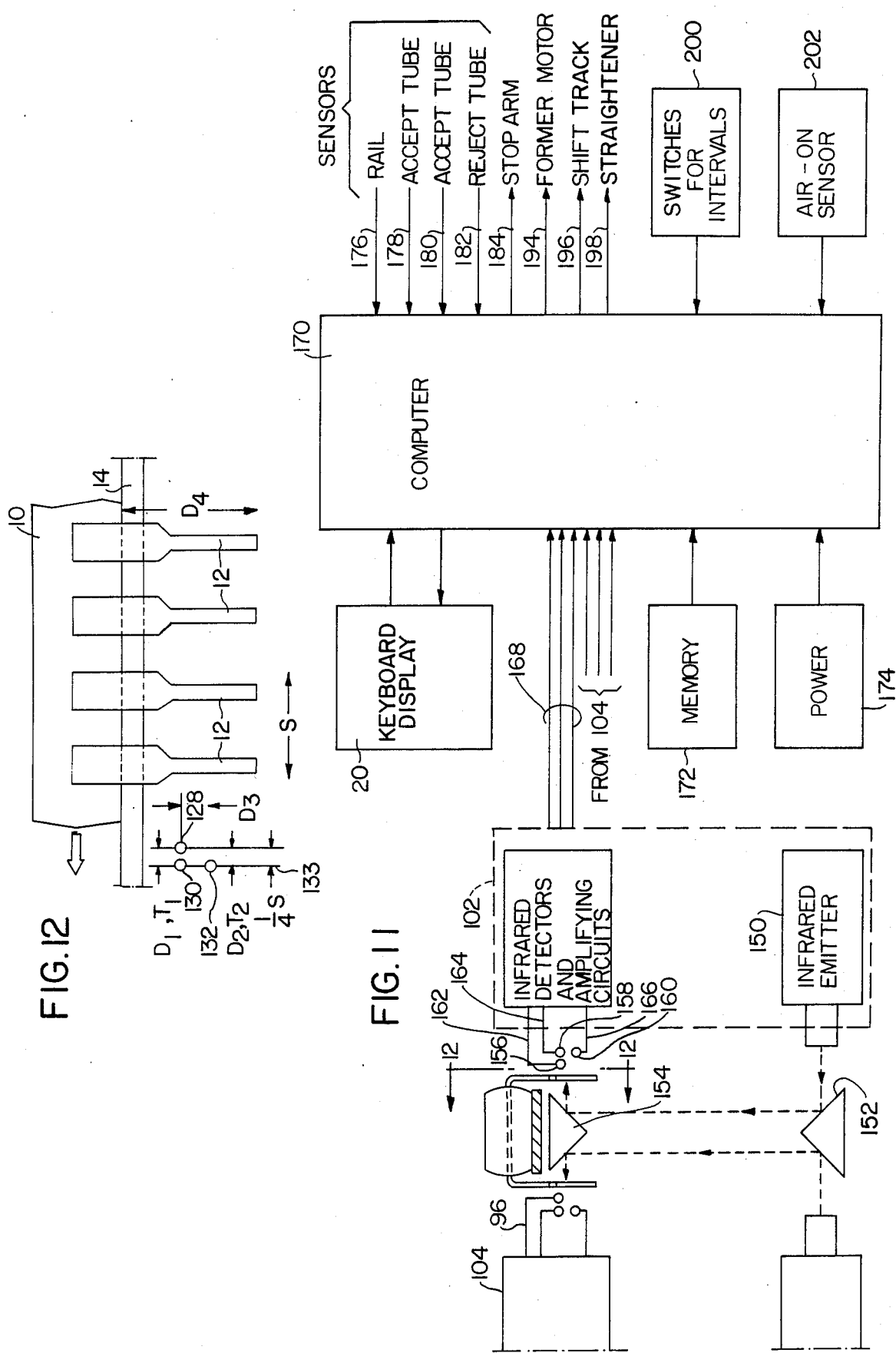

APPARATUS AND METHOD FOR LEAD INTEGRITY DETERMINATION FOR DIP DEVICES

FIELD OF THE INVENTION

The present invention broadly relates to a new and improved method and apparatus for determining lead integrity of electronic components. More specifically, the invention is directed to a novel method and apparatus for determining lead integrity of so-called dual-in-line-package (DIP) devices, typically used for the assembly of integrated circuits on printed circuit boards (PCB), for example, RAM, ROM, PROM, EPROM, and CPU devices.

DIP devices are typically comprised of an elongated generally rectangular body portion made of moldable material and having embedded therein a plurality of leads arranged in rows depending from opposite side edges of the body portion and disposed at a predetermined angular relation thereto, usually perpendicular. The leads, for appropriate use in a PCB, requires lead disposition at a preferred predetermined angle in relation to the body and in substantial parallel mutual relationship, one to another. To this end, during manufacture of DIP devices a protective harness, to maintain leads in straight parallel relation, is connected to the outer terminal ends of the leads. An inverted U-shaped bridge is typically integrally formed at opposite ends of the body portion connecting the tie bars on each side. Prior to PCB assembly, the harness and bridges are removed to allow the insertion of the DIP device into a socket containing a plurality of prepatterned openings. Since the leads of DIP devices are somewhat fragile and tend to bend during handling and shipment from a given predetermined orientation for PCB installation, it is necessary to determine the integrity of the leads prior to their attempted mounting. Integrity as used herein includes the determination of whether any of the leads are missing, whether any of the leads have been misaligned with regard to their previous perpendicular relationship with the DIP device body, and whether the leads have changed their parallel mutual relationship.

BACKGROUND OF THE INVENTION

As is well known in the art, DIP devices consisting of a body portion, and attached and depending leads connected thereto for assembly into a PCB or the like, are manufactured with the leads disposed in a particular arrangement adapted for insertion in the predetermined array or pattern of holes or sockets in a PCB. The material of the leads and their connection to, and disposition on, the DIP bodies frequently results in a bending or distortion of the leads due to handling during manufacturing operations.

Since bent or distorted leads of DIP devices will prevent their insertion into predetermined arrays or sockets in a PCB, a need exists for apparatus which determine the integrity of DIP leads prior to insertion on a PCB. As a response to this need, lead straighteners were developed, such as that described in patent application Ser. No. 363,128 now U.S. Pat. No. 4,481,984 for ELECTRONIC COMPONENT LEAD STRAIGHTENING DEVICE, also owned by the assignee of the instant application. Without a device for determining lead integrity, proper orientation of DIP leads could only be assured by passing every DIP device through a lead straightening apparatus prior to insertion on a PCB.

One device presently known for determining lead integrity, provides a set of two photo sensitive devices aligned one over the other on an axis parallel to the axis of DIP leads which are in proper substantial parallel mutual relationship. DIP leads are caused to intercept a light beam directed at the photo sensitive devices by driving DIP devices past the photosensors through the use of a motor driven belt arrangement. An alternative way of visualizing the orientation of DIP leads and photo sensitive devices in such prior apparatus is to consider the path of travel of a DIP device on a trackway. DIP leads extend downward on either side of the trackway and are generally oriented perpendicular to the direction of travel of the DIPs. Two sets of photo sensitive devices are oriented on either side of the trackway along axes which are also perpendicular to the direction of travel. Improperly oriented DIP leads will deviate at an angle from this perpendicular orientation. Thus, as the leads pass in proximity to the photo sensitive devices, if the light to one of the photo devices is blocked while the other continues to receive light, there is an indication that the DIP lead is bent. The difficulties with such a system is that the motor and belts must be carefully regulated to maintain a constant speed while scanning occurs. Failure to maintain constant speed can result in false deviation determinations. Consequently, DIP devices which could be straightened and used, will be rejected and discarded, which indicates the inefficiency of such prior device.

A further known integrity determination device transmits light in a direction perpendicular to the path of travel of the DIP, i.e. beneath a trackway on which DIP devices travel, such that light from one source travels across the entire width of the DIP device to a photo sensor. It will be readily seen that if one row of leads is bent and one row of leads is in a proper orientation, such a prior system will indicate that all leads of a particular DIP device are acceptably oriented.

Thus, none of these devices can ensure lead integrity in all situations. Further, none of the above devices can assure that DIP leads are not bent inwardly, i.e. towards the center of the DIP. Such an orientation is also to be prevented to provide proper mounting of DIP devices to PCBs and the like.

SUMMARY OF THE INVENTION

The present invention provides method and apparatus for determining lead integrity of DIP devices which is characterized by novel features of construction and arrangement which eliminates some of the problems of prior devices discussed above. A principal feature of the present invention resides in a scanner assembly which essentially comprises a pair of scanner heads disposed on either side of a trackway for the travel of DIP devices thereon wherein the leads of the DIP devices extend downwardly on either side of the trackway generally perpendicular thereto. Each scanner head has a groove formed at one end, which groove is positioned beneath the outer edges of the trackway, such that as DIP devices travel the length of the track, the leads of the DIP devices will pass through the grooves in the scanner heads. The grooves in the scanner head are generally parallel to the center line of the track. Light is transmitted across a portion of the groove to an arrangement of photo sensors which convert the light signal to an electrical signal. Integrity is determined by analyzing the interception of the light by DIP leads.

The scanner assembly in a preferred arrangement is combined in an apparatus having a number of stations for various operations on DIP devices. Each of such stations may include pneumatic, electronic or mechanical sub-assemblies. Such apparatus broadly includes an elongated fixed trackway having a loading station at one end. The loading station aligns a cartridge containing a number of DIP devices with the trackway for passage of DIP devices from cartridge to trackway. DIP devices passing onto the trackway travel to a former station where DIP leads are passed over an anvil having tapered surfaces to assure that DIP leads are not bent excessively inwardly or outwardly from the center of the DIP. DIP devices pass from the former station through the scanner assembly where any further deviations of the leads are determined. Such a determination is accomplished for example by a computer analysis of the signals from the from the scanner heads. If it is determined that the leads require straightening, the DIP passes to a straightening station where it is stopped momentarily for a straightening operation to occur before passing to a discharge station for placement in a cartridge designated for acceptable DIP devices. If it is determined at the scanning station that straightening could still not ensure lead integrity, i.e. if leads are missing, the DIP device will pass directly through the straightening station to the discharge station, for placement in a cartridge designated for rejected DIP devices. The combination of the scanner heads of the instant invention with a lead straightener in an integrity/straightening system not only assures the integrity of the angular orientation of the leads of DIP devices, but also increases by severalfold, the capacity to determine the integrity of the leads of DIP devices.

Additionally, the scanner head design provides a novel size adjustment arrangement for various width DIP devices. Each scanner head contains a transmitting means and receiving means. The transmitting means is for the transmission of a signal such as light across the groove in the scanner head so that the leads of DIP devices traveling on the trackway will intersect the light signal when passing through the groove. Receiving means such as photo sensors are positioned on a side of the groove opposite the transmitting means to receive the intersected light signal and is capable of converting said signal to an electrical signal. Since these components are self-contained in each head, it becomes necessary only to position the groove relative to the center line of the trackway for various width DIP devices.

With the foregoing in mind, it is broadly an object of the present invention to provide a new and improved method and apparatus for automatically determining the integrity of leads of electronic components, particularly DIP devices of the type described above.

Another object of the present invention is to provide a method and apparatus for determining lead integrity of DIP devices which incorporates a fixed trackway and wherein as DIP devices travel on said trackway, the integrity of the leads may be easily and quickly determined.

Another object of the present invention is to provide a method and apparatus for determining lead integrity of DIP devices which incorporates a transmission member for transmitting a signal in relation to a fixed trackway so that leads of DIP devices traveling on the trackway intersect the transmitted signal and arranging a receiving device for receiving the intersected transmission and for converting the received transmission to an electrical signal reflective of the intersection by the leads.

Another object of the present invention is to provide a method and apparatus for determining the lead integrity of DIP devices which includes a computer device for determining the integrity of the leads based upon electrical signals received from scanner devices positioned on either side of a trackway on which the DIP devices travel.

Yet another object of the present invention is to provide a method and apparatus for determining the lead integrity of DIP devices by providing a pair of scanning heads on either side of a fixed trackway, wherein the scanning heads include both a transmission device for transmitting a signal across the path of the leads of DIP devices traveling on the trackway and receiving devices for receiving the intersected signal, which receiving devices are arranged in a triangular pattern such that the base of the triangle is substantially parallel to the track and the side of the triangle is oriented downstream in the direction of travel of DIP devices on the track.

DESCRIPTION OF THE DRAWINGS

These and other objects of the present invention and the various features and details of the operation and construction thereof are hereinafter more fully set forth with reference to the accompanying drawings, wherein:

FIG. 1 is a side view of an apparatus for determining the integrity of DIP devices;

FIG. 2 is a sectional view along line 2—2 of FIG. 1;

FIG. 6 is a partial perspective view of the scanner head and former assembly of the enlarged view of FIG. 4;

FIG. 7 is a sectional view along the line 7—7 of FIG. 6;

FIG. 8 is a sectional view along the line 8—8 of FIG. 7;

FIG. 9 is a sectional view along the line 9—9 of FIG. 7;

FIG. 10 is a sectional view along the line 10—10 of FIG. 7;

FIG. 11 is a block diagram of the electronic control components of the instant invention;

FIG. 12 is a diagrammatic view of the leads of a DIP device in relation to the triangular arrangement of fiber optics;

DESCRIPTION OF THE PREFERRED EMBODIMENTS

Figure 13:
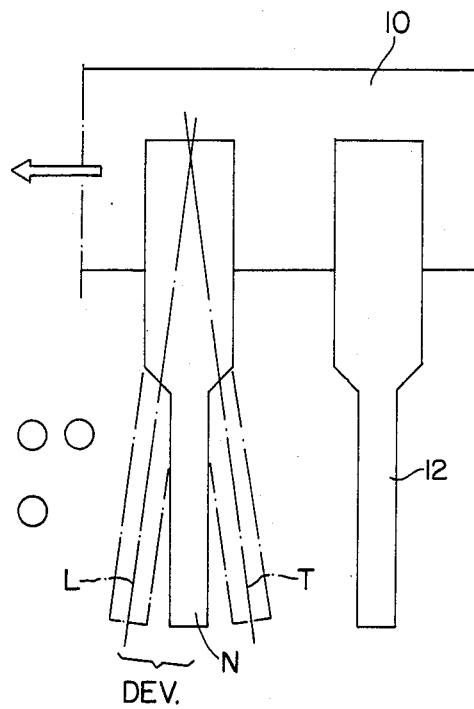
FIG. 13 is an enlarged diagrammatic view showing the angular deviation of DIP leads which is determined by the scanner assembly.

The system and apparatus of the present invention are adapted for determining the lead integrity of DIP devices. Before describing the perferred embodiments of the apparatus, reference is initially made to a description of a DIP device, such as that shown perspectively in FIG. 6, with various lead orientations, as shown in FIG. 13. Generally, DIP devices house integrated circuit technology and comprise an elongated generally rectangular body portion 10 made of a moldable material such as ceramic or plastic, and having embedded therein a plurality of leads or pins 12, which normally are uniformly parallel spaced and in straight rows generally perpendicular to the body portion 10. As shown in FIG. 13, if leads 12, particularly the lead tips, have either a leading (L) angular orientation or a trailing (T) angular orientation relative to the direction of travel, they will be unsuitable for mounting onto a printed circuit board (PCB) containing a predetermined pattern of holes or sockets. As will be appreciated, attempted mounting of a DIP device having leads with such angular orientations would result in gross deformation of the leads when lead tips come into contact with the PCB during the mounting operation and in all likelihood unacceptable contact with the circuit printed on the PCB. A DIP device having leads with such leading or trailing orientations will require a straightening operation prior to their insertion or mounting onto PCBs.

The method of the invention will be presented hereinafter in conjunction with the description of apparatus for determining lead integrity of DIP devices. A general understanding of the basic structure and operation of the apparatus may be gained by several of the views which best show the basic components of the apparatus in operation thereof such as FIGS. 1-3. Considering first the basic components of the integrity apparatus in terms of interrelated functions, the apparatus as best illustrated in FIG. 1 includes an elongated fixed trackway 14 having a loading station $S_L$ at its upper end, a former station $S_F$ downstream in the direction of travel of DIP devices on trackway 14, a scanning station $S_S$, a straightening station $S_{ST}$ and a discharge station $S_D$ at its lower end. A cartridge C for DIP devices housed therein in abutting end-to-end relation is adapted to be positioned at the loading station $S_L$ so that the DIP devices are gravity fed down the trackway 14 through the various stations described above. These DIP devices are presented to loading station $S_L$ by positioning an open end of cartridge C into a rotatable turret-like mechanism 16. Mechanism 16 is turned to align the open end of cartridge C with track 14 so that DIP devices flow freely from the cartridge or tube onto track 14 to former station $S_F$. Position control means in the form of elastomeric belts and a detent mechanism are provided in the former station $S_F$ and the straightening station $S_{ST}$, respectively, which operate in response to an internal computer for controlling the movement of DIP devices through the apparatus. The control system as described in more detail hereafter, also includes means for sensing various positions of DIP devices on trackway 14 to control operation of the elastomeric belt and detent mechanism to effect automatic continous cycling of the scanner apparatus facilitating high speed processing of DIP devices.

Tracing now briefly a typical cycle of operation, DIP devices initially encounter the former station $S_F$ wherein the elastomeric belts function to release DIP devices one at a time to the scanning station $S_S$ so that only a single DIP device may pass through the scanning station $S_S$ and to the straightening station $S_{ST}$ when the straightening station is conditioned or clear to receive a device for straightening. DIP devices are able to pass freely through the scanning station due to the high speed determination of lead integrity by the internal computer. If the computer, based on the signals received from the scanning station, determines that DIP leads require straightening, DIP devices entering the straightening station are detained by a stop mechanism. A straightening operation thereafter ensues. The details of such straightening operation will not be described in depth herein, as they are described in greater detail in Linker et al U.S. Pat. No. 3,880,205, METHOD AND APPARATUS FOR STRAIGHTENING ELECTRONIC COMPONENTS, and in a co-pending application for ELECTRONIC COMPONENT LEAD STRAIGHTENING DEVICE Ser. No. 363,128 filed Mar. 29, 1982, both assigned to the assignee of the instant invention and incorporated herein by reference. Following the straightening operation, the stop mechanism is raised allowing the DIP device to pass to the discharge station where the DIP in turn is placed on a cartridge designated for acceptable DIP devices. As the DIP device passes through the scanning station, if the computer determines that leads are missing from the DIP device, or that the DIP leads are so distorted that the straightener would not be able to properly reorient the leads, the DIP device is allowed to pass through the straightening station $S_{ST}$ directly to the discharge station whereupon it is placed into a cartridge designated for rejected DIP devices.

Referring now to the specific structure of the apparatus, FIG. 1 shows the apparatus as including an elongated guide rail 18 which is coextensive with the trackway 14 and spaced above same so that DIP devices are captive between the track and guide rail during their movement through the apparatus. The space between the guide rail and the trackway is adjustable for DIP devices of different sizes. The guide rail is further mounted for pivoting movement on face plate 22 of the apparatus to a retracted position exposing the track for complete access to the trackway in the event of DIP jamming or the like.

Suitable controls, including circuitry, to be described in more detail hereafter, are provided for effecting operation of the lead integrity apparatus in the manner broadly described above. A control panel 20 is mounted on face plate 22 within easy view of the operator and includes the various automatic controls for the electronic and pneumatic control systems, i.e. sub-assemblies. A manual control 24 is also provided for moving former halves 26 and 28 towards and away from trackway 14 by any known mechanical means. The former halves serve to force DIP leads over the tapered surface of an anvil to assure the outward angular orientation of the leads. An indicator 30 is provided such that separation of former halves 26 and 28 will be indicated. Thus, the former halves can be separated a prescribed distance to account for various width DIP devices. Face plate 22 is mounted to base 32 by pivot 34. Face plate 22 can be opened outwardly from base 32 by the pressing of latch button 36. The outward opening of base plate 22 serves for ease and maintenance of those components disposed beneath the face plate in the scanner apparatus.

Figure 3:
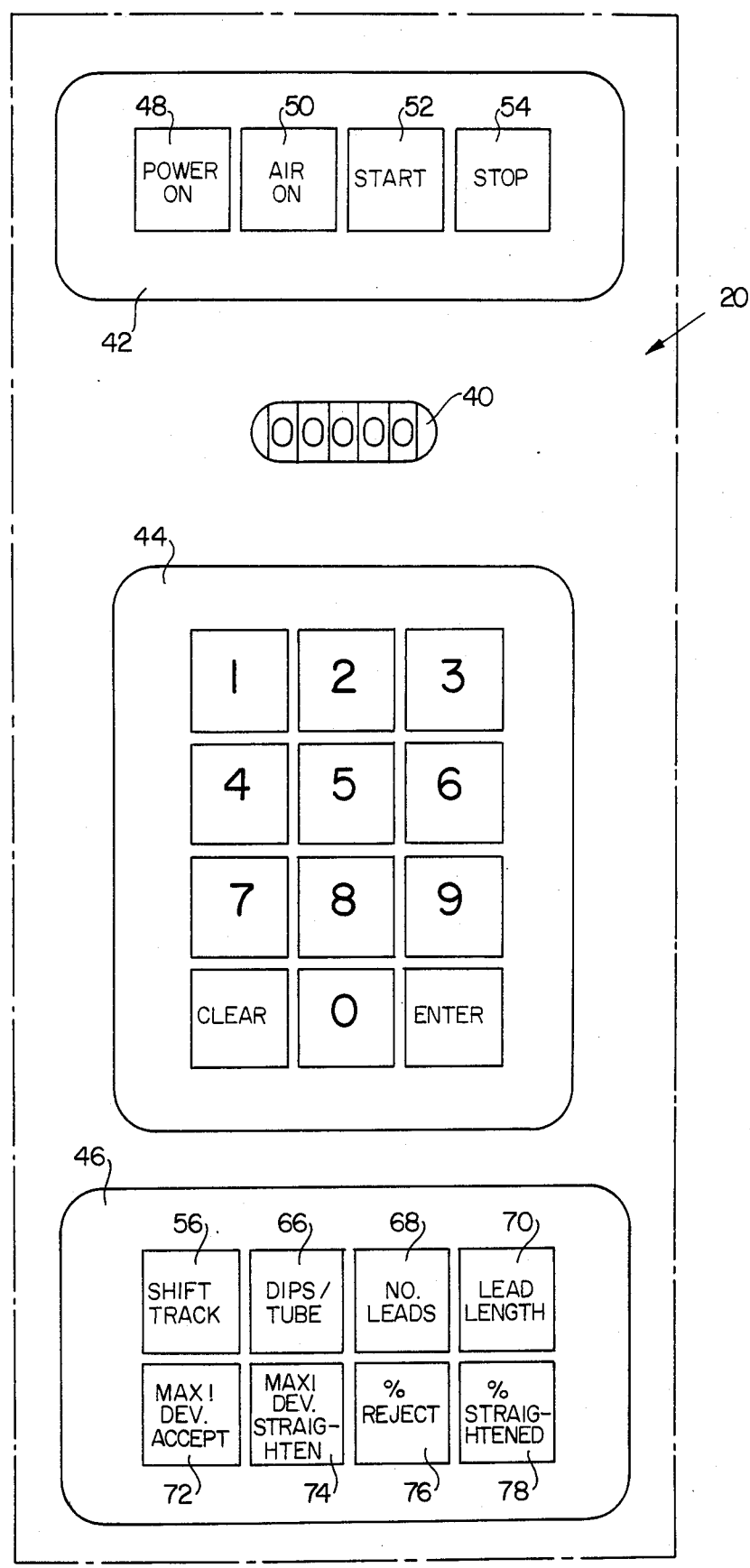
FIG. 3 is a partial enlarged view of the control panel of FIG. 2.

FIG. 3 more particularly discloses the automatic controls contained on control panel 20. Generally, control panel 20 includes a numeric display 40 and three pads of switches, namely, control pad 42, numeric pad 44 and data pad 46. Control pad 42 includes a power-on indicator 48 for indicating that power is being supplied to the apparatus by a power-on switch located elsewhere on the apparatus and not shown in the drawings, and an air-on switch 50 for supplying air to the various pneumatic components of the apparatus. Start and stop switches 52 and 54, respectively, are provided for initiating and interrupting the cycle of operation of the overall apparatus.

Function pad 46 is provided with eight function switches. Shift track switch 56 is operative to move shift track 58 in the discharge station $S_D$ to any one of three alignment positions, two positions for aligning accept tubes with trackway 14 and one alignment position for positioning a reject tube at the end of the trackway. Although not shown in specific detail in the drawings herein, discharge station $S_D$ includes a transversely movable shift track 58 which aligns any one of three trackway sections 60, 62 and 64 with trackway 14. DIP devices passing from trackway 14 onto to any one of the shift track sections will be directed to the particular cartridge C associated with that shift track portion. In the preferred embodiment, the shift track is actuated pneumatically by a series of air-actuated cylinders.

Data entry switch 66 is provided for entering the number of DIP devices which will be placed into each cartridge C contained in the discharge station $S_D$. As will be described in more detail hereinafter, a sensor located in the discharge station provides a signal to the internal computer each time a DIP device passes into a particular tube. The computer counts the number of DIPs which are placed in each tube. If the count equals the amount entered after pushing switch 66, the computer stops the automatic cycling of the integrity apparatus until the full cartridge has been removed and an empty cartridge inserted in its place.

Switch 68 is pressed prior to entering data into the computer as to the number of leads per DIP device which will be scanned. As the DIP device passes through the scanner heads, if the number of leads counted does not equal the number of leads entered with switch 68, the DIP device will be automatically rejected as having missing leads.

Switch 70 is used to enter data into the computer concerning the length of the leads on the DIP devices. This lead length plays a part in the calculation used in the preferred embodiment for determining the angular lead tip deviation of the DIP device.

Switch 72 is used to enter the maximum acceptable deviation. In other words, the amount by which lead tip may be deviate from their orientation perpendicular to body 10 before they will require straightening. DIP devices having leads which all fall below this maximum acceptable deviation, will pass directly to one of the cartridges designated for acceptable DIP devices and will not be stopped in the straightening station. Deviation of a lead tip from its normal perpendicular orientation is illustrated in FIG. 13. Along these same lines, switch 74 is provided for entering data into the computer with regard to the maximum deviation for straightening. In other words, if the DIP lead is leading or trailing its normal perpendicular position by an amount which exceeds the deviation entered with switch 74, the straightening device cannot perform a successful operation on the leads. Consequently, such a DIP is placed directly to the cartridge designated for rejected devices.

Switch 76 is not for the purposes of entering data, but rather, depressing switch 76 will list on display 40 the cumulative precent of DIP devices passing through the scanning heads which have been rejected. Likewise, depressing switch 78 will list on display 40 the cumulative percent of DIP devices which passed through the scanner heads and were subseqently straightened by the straightening heads.

Figure 4:
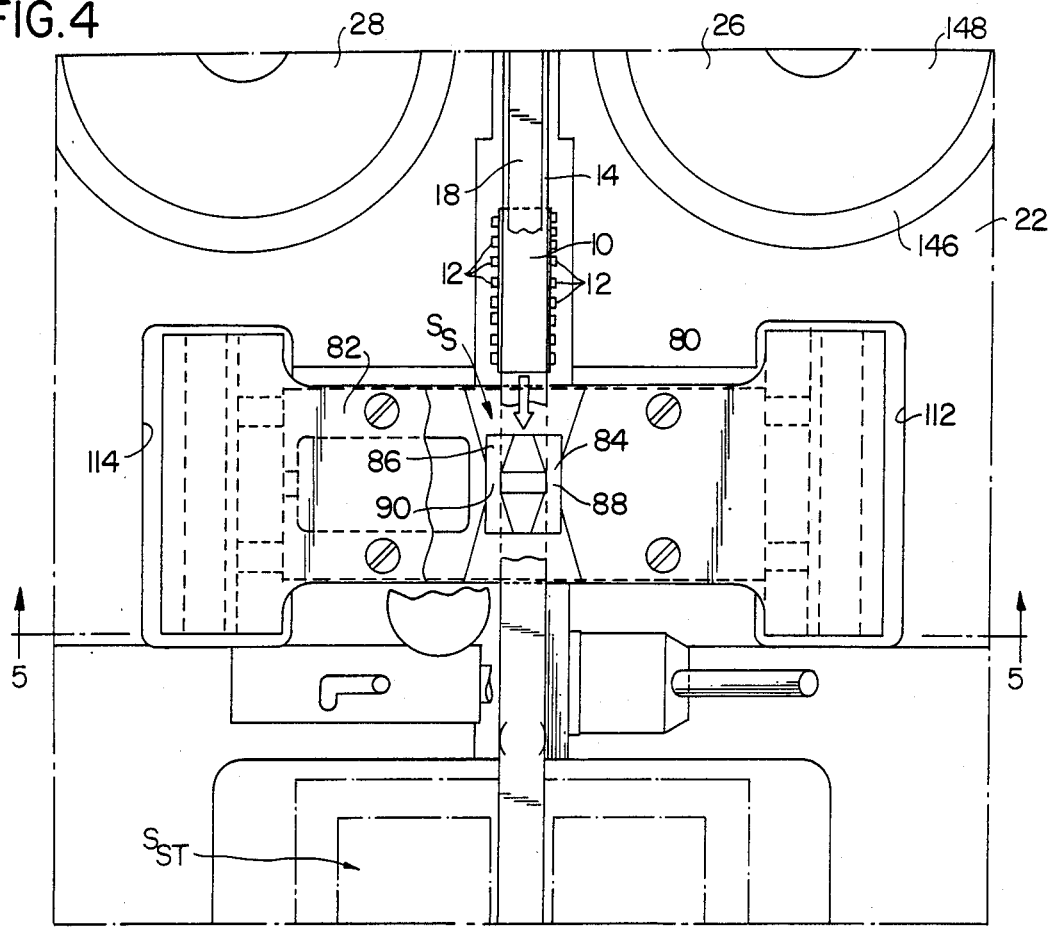
FIG. 4 is a partial enlarged view of the scanning station shown in FIG. 2.

Consider now more specifically the structure of the scanner heads. FIG. 4 shows the relationship and positioning of scanner heads 80 and 82. Each scanning head is shown to contain a groove 84 and 86, respectively, which is oriented generally parallel to the trackway 14. To promote the smooth passage of leads through grooves 84 and 86, the input ends are provided with converging tapered walls and the output ends are provided with diverging tapered walls. At the apex of the groove, points 88 and 90 respectively, scanning of the leads takes place. In the preferred embodiment, scanning is accomplished by the transmission of an infrared light signal across apex 88 and 90 to a set of receptors located in the side wall 92 and 94, shown in FIG. 6. As the leads of DIP device 10 intersect the infrared light transmission, the set of receptors will pick up such intersection at varying time intervals. In the preferred embodiment, the receptors comprise a series of fiber optic tubes 96 98 and 100 (only shown for scanner head 82, but also contained in scanner head 80) which transmit the light from apex 88 and 90 to a series of phototransducers which convert the light signal to an electrical signal. In the preferred embodiment, such a phototransducer is the CLT 3020 sold by Clairex Electronics of Mount Vernon, N.Y. The phototransducers and the electronic circuitry used to amplify and refine the electrical signal are integrally contained within each scanner head in containers 102 and 104, respectively.

Figure 5:
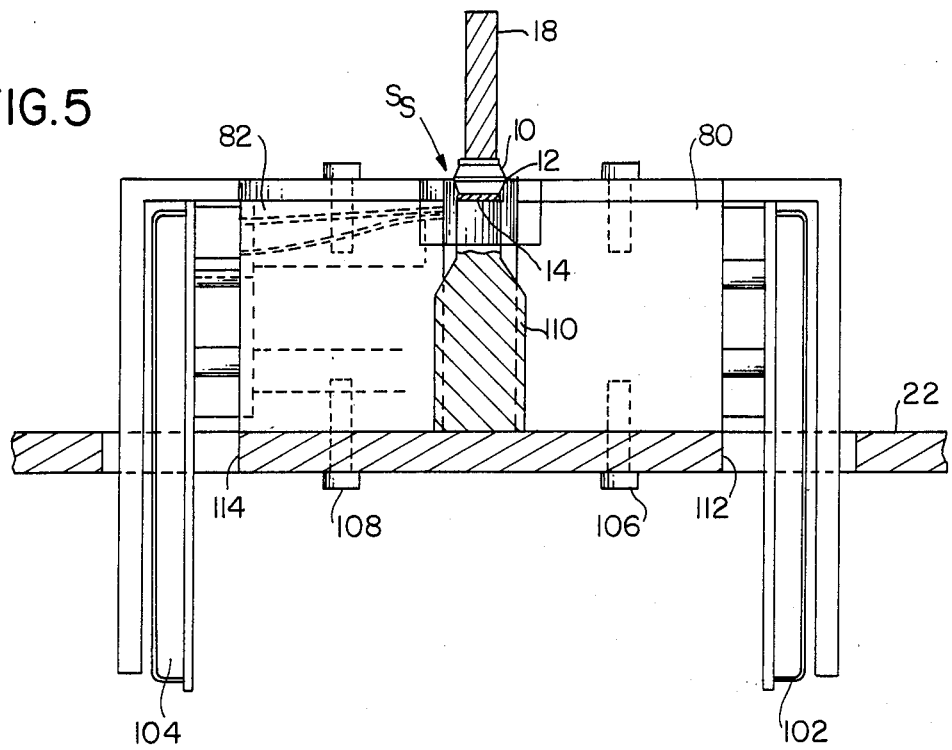
FIG. 5 is a sectional view along line 5—5 of FIG. 2.

As is shown FIG. 5, scanner heads 80 and 82 are securely attached to face plate 22 by bolts 106 and 108. Also attached to face plate 22 is support 110 on which trackway 14 is securely mounted. Openings 112 and 114 are provided so that scanner heads 80 and 82 may be adjusted towards and away from trackway 14 for DIP devices of varying widths. Such transverse adjustments can be made by loosening bolts 106 and 108.

As shown in FIG. 7, an infrared light source 116 transmits lights through bore 118 to reflective surface 120. Surface 120 is angularly oriented to reflect the infrared light upwardly through bore 122 to reflective surface 124. Surface 124 is angularly oriented to further reflect the infrared light across apex 90 to the fiber optic tubes. It has been found that if light source 116 is placed, for example, at the location of surface 124, so that it transmits directly across apex 90, rather than being recessed to reflect off surfaces 120, 124, a problem with fanning of the light will occur. By fanning we mean that as a DIP lead passes light source 116, portions of the shadow created by the lead will appear at, for example, orifices 130, 132, which are downstream in the direction of travel. Since the DIP lead has not yet traveled to those points, incorrect lead tip deviation will be determined In alleviating this problem, we have discovered that recessing light source 116 in bores 118, 122, preferably 1⅞ to 2 inches, in the scanning head causes the DIP lead shadow to substantially only appear at the orifice corresponding to the travel of the lead at that point. Such recess distance is calculated by measuring the distance from light source 116 to side wall 94.

The housing in which these various elements are contained is preferably made of an opaque plastic material. Chamber 126 is preferred so that in the manufacturing process orifices 128, 130 and 132, shown in FIG. 10, can be precision drilled with regard to the distances therebetween. The importance of the distances between these orifices will be discussed in greater detail hereinafter Further, in the preferred embodiment, after insertion of the fiber optic tubes, chamber 126 is filled with an opaque epoxy resin which serves to isolate and support the fiber -optic tubes 96, 98 and 100. Orifices 136, 138 and 140 are illustrated in FIG. 9 for the purpose of showing that the ends of the fiber optic tubes have been separated. This separation enhances not only their mounting to the photo transducers, but serves to further isolate the light transmitted within each fiber optic tube from being influenced by light contained in any one of the other tubes.

FIG. 6 also discloses the major components of former station $S_F$. As is shown therein, two anvil halves 142 and 144 are disposed beneath the trackway 14 for engagement with leads of DIP devices. Elastomeric belt 146 is driven by gear 148 which is operatively connected to a drive motor (not shown in the drawing). Elastomeric belt 146 forces the leads of a DIP device traveling through the former station against the tapered surfaces of the anvil. The anvil surfaces force the leads to bend outwardly from the center line of trackway 14. Since the DIP leads are pressed against the anvil halves by elastomeric belt 146, stopping the drive motor will serve to halt the flow of DIP devices through the former station. Thus, the flow of DIP devices from the loading station $S_L$ can be singularized or separated by a predetermined delay interval.

Reference is now made to FIG. 11 wherein the internal computer will be described in greater detail. In connection with this figure only the relationship between component 102 of scanner head 80 will be discussed, however, it is to be assumed that similar connections are made for component 104 of scanner head 82. Similar to scanner head 82, scanner head 80 contains an infrared emitter 150 which directs light to reflective surface 152. Surface 152 is angularly oriented and cooperates with reflective surface 154 to direct light across apex 88 to orifices 156, 158 and 160. Positioned in those orifices are fiber optic tubes 162, 164 and 166 respectively. The fiber optic tubes direct light into appropriate infrared detectors, whereupon the light is converted to an electrical signal. The electrical signal is amplified and transmitted via conductive leads 168 to internal computer 170.

Computer 170 is of a design known in the art and includes in the preferred embodiment an 8031 microprocessor manufactured by Intel Corporation. Through the use of large scale integration (LSI) peripheral devices, the keyboard and display shown in FIG. 3 can be interfaced with the microprocessor in a manner known in the art. Memory 172 is connected to computer 170 and serves to store the software programming to be described in more detail hereinafter. Power is provided to computer 170 by an appropriate power supply 174.

A plurality of sensors, in addition to the infrared detectors, are connected to computer 170 by various conductive leads. For example, conductive lead 176 connects the rail closed sensor to the computer for an indication that guide rail 18 is in place over trackway 14. Conductive leads 178 and 180 connect the sensors associated with the accept cartridges in discharge station $S_D$. Conductive lead 182 connects the sensor associated with the reject cartridge to computer 170.

Several conductive leads are also connected to the computer for providing actuation or deactivation signals to various components in the scanner apparatus. For example, conductive lead 184 provides an actuation and deactivation signal to air operated cylinder 186 shown in FIG. 14. Cylinder 186 serves to lower stop arm 188 down on to trackway 14 stopping the passage of DIP devices in the straightener station $S_{ST}$. Stop arm 188 rotates about pivot point 190 and is biased by spring 192 in a normally upward or open position such that DIP devices are free to travel through the straightening station.

Conductive lead 194 serves to provide the activation and deactivation signal to the former motor, which in turn continues or stops movement of DIP devices through the scanner apparatus. Conductive lead 196 provides the activation signal to the shift track operation device in discharge station $S_D$. Depending upon the signal transmitted on conductive lead 196, the shift track will move transversely relative to trackway 14, aligning one of the accept cartridges or the reject cartridge with the trackway. Conductive lead 198 provides the actuating signal to the straightener mechanism should the computer determine that the DIP devices passing on trackway 14 requires lead straightening.

Switch device 200 contains a series of manual switches providing input to computer 170 for the distance intervals between orifices 128, 130 and 132 and between orifices 156, 158 and 160. In the preferred embodiment, such manual switches represent varying amounts of thousandths of inches. The importance of these intervals between the orifices lies in their inclusion in a formula for determining the angular orientation of particular DIP leads. Referring specifically to FIG. 12, intervals D1, D2, D3, D4, T1 and T2 are indicated. D1 represents the distance between orifice 130 and 128; D2 represents the distance between orifice 132 and a line passing through the center of orifice 128 which also lies parallel to the line 133 which passes through the center of orifices 130 and 132. D3 represents the distance between orifices 130 and 132 and D4 represents the distance from the top face of trackway 14, which contacts body 10 of the DIP device, and the end of the DIP leads. It is believed that it is a present industry standard that distance D4 be greater than or equal to 150 thousandths of an inch. Consequently, orifices 132, 160 will be at least 150 thousandths of an inch away from a plane containing the top surface of trackway 14. Each of these values is entered into the computer by means of switch device 200. T1 and T2 represent time intervals or count intervals which are determined by DIP lead intersecting light passing through the scanner head orifices.

The computer contains a series of counters which are operating in the preferred embodiment at a frequency of approximately 1 MHz. In FIG. 12 these counters are started by leads intersecting the infrared light beam passing through orifice 128. At least two such counters are provided. One of the counters is stopped from counting by a lead intersecting the infrared light beam passing through orifice 130, while the other counter is stopped from counting by the intersection of a DIP lead with the infrared light beam passing through orifice 132. The resultant counts are converted by the computer into corresponding time intervals which represent the time for a lead to pass in front of orifice 128 and travel to orifices 130 and 132.

In the preferred embodiment, the formula used to determine angular orientation requires that the orifices 128, 130 and 132 be arranged in the pattern shown in FIGS. 11, 12 and 13, that is, a right triangular pattern wherein the base of the triangle is oriented substantially parallel to trackway 14 and wherein the side of the triangle is oriented substantially perpendicular to trackway 14 and lies downstream in the direction of travel and wherein the receptor positioned at the point of intersection of the side and hypotenuse of the triangle, orifice 132, is located perpendicularly further from trackway 14 than the base of the triangle containing orifices 128 and 130. The formula which is used by the computer to determine the angular deviation of DIP lead tips is as follows:

$$\text{Integrity} = \frac{\frac{(X \cdot T_1) - T_2}{(X \cdot T_1)} \cdot D_1}{D_3} \cdot D_4$$

wherein $D_1$=the length of said base of said traingle; $D_3$=the length of said side of said traingle; $D_4$=the length of said lead; $T_1$=time for a lead to pass between receptor's position on the base of said triangle; $T_2$=the time for leads to pass between the upstream receptor and the receptor located at the intersection of said side and said hypotenuse of said triangle; X=the percent difference between $D_1$ and $D_2$; and $D_2$=the distance from the receptor, positioned at said intersection of the side and hypotenuse of said triangle, along a line parallel to said base to an axis which passes through the receptor, positioned at the intersection of the base and hypotenuse of said triangle, and which axis is perpendicular to said base.

It has been found that the use of the above formula in the instant apparatus provides such precise determination of lead tip deviation that various factors, particularly including tolerances and manufacturing errors of both the scanner head orifices and light reception devices, i.e. CLT-3020, must be taken into account. This is accomplished in the present invention by passing DIP devices having known lead tip deviations through the apparatus. Switch device 200 is thereafter manually changed until such known deviations are determined by the apparatus. It has further been found that such calibration procedure must be performed with each scanning head. Consequently, if one scanning head, for example head 80, were replaced, the calibration procedure should be repeated for the substitute head.

Once the angular orientation of a DIP lead has been calculated, it is compared to the maximum acceptable deviation and the maximum deviation for straightening all of which will be described in more detail in connection with the programming for computer 170. However briefly if the calculated orientation is less than the maximum acceptable deviation, DIP devices will pass through the straightening station directly to a cartridge designated for acceptable DIP devices. If the calculated DIP lead orientation is above this maximum but below the maximum deviation for straightening, the DIP device will be halted in straightening station $S_T$ by stop arm 188 and a straightening operation will ensue. If the calculated DIP lead orientation is greater than the maximum acceptable deviation and greater than the maximum deviation for straightening, the angular orientation is such that a straightening operation will not assure lead integrity. Therefore, such a DIP device will pass directly to a cartridge designated for rejected DIP devices.

Figure 15:
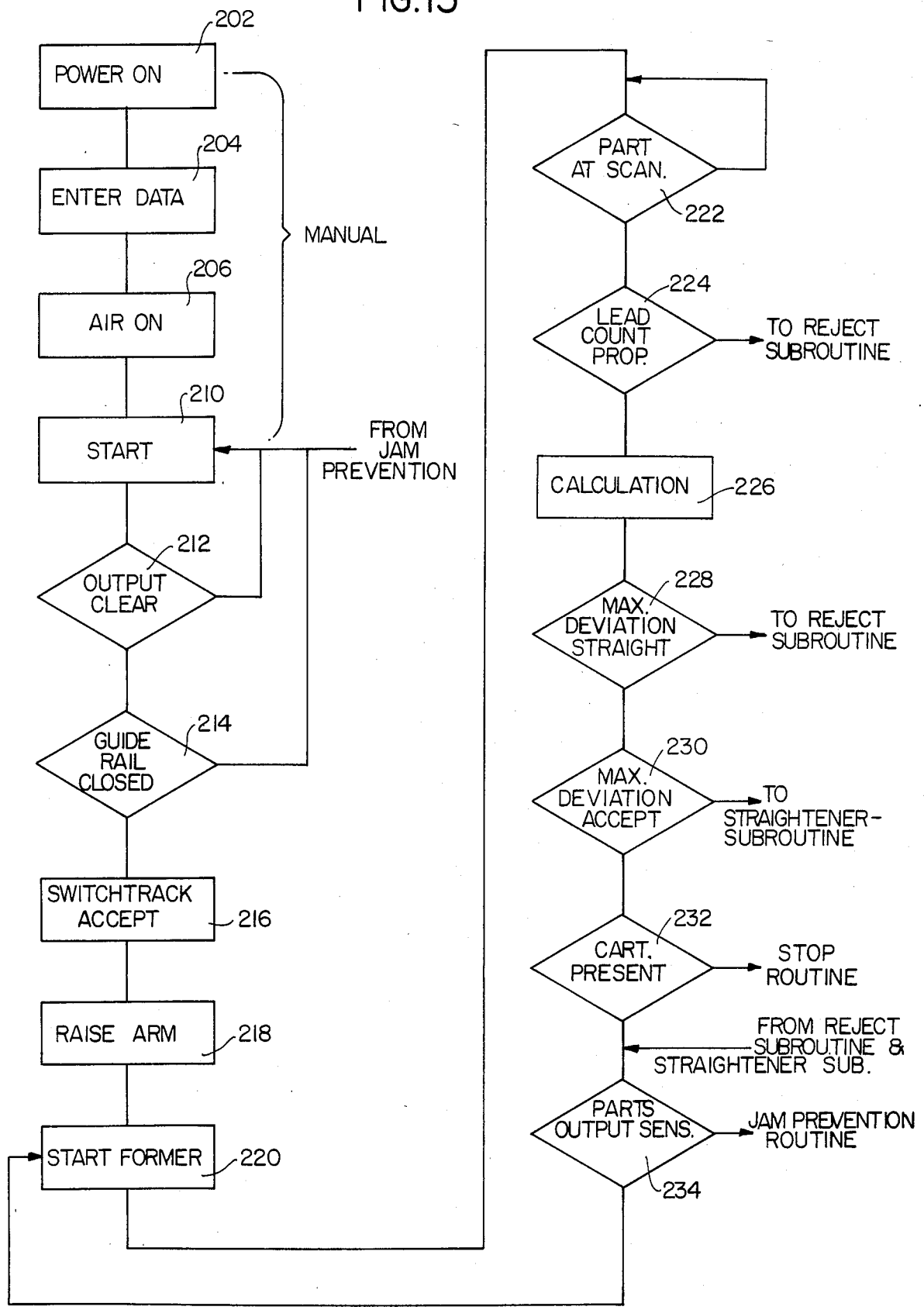
FIG. 15 is a flow chart of the main operating program for the computer shown in FIG. 11.

Considering now the programming provided for computer 170 which is contained in memory 172. A review of this programming will also directly indicate an example of the automatic cycling of the apparatus. FIG. 15 shows the flow chart for the main program used in the computer. The first four steps, 202-210 involve manual operations, wherein step 202 involves the power supply on which activates all of the electronic components in the system including computer 170. Once the computer has been enabled, data is thereafter entered at step 204 for the number of DIPs per lead, deviations, etc. At step 206, air is provided to the pneumatic devices in the apparatus. A sensor, preferably a pressure/electric switch known in the art, is used to detect whether air is being supplied to the pneumatic devices in the apparatus and provides input to computer 170 in that regard.

Figure 14:
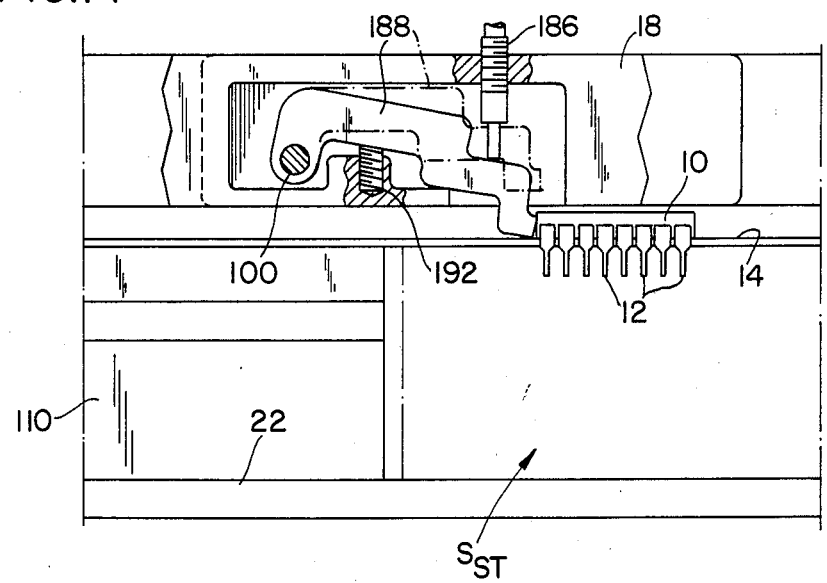
FIG. 14 is a partial sectional view along the line 14—14 of FIG. 2.

The apparatus is now ready to begin determining lead integrity of various DIP devices. The automatic cycling is initiated by depressing the start switch at step 210. Once the start switch has been depressed, computer 170 first determines whether the output of the apparatus is clear. Such status is determined by signals appearing on conductive leads 178, 180 and 182 from sensor 179, 181 and 183, respectively. If the output is not clear the computer goes back to the manual start situation. If the output is in fact clear, the computer next determines at steps 214 whether the guide rail 18 is in the closed position. If the guide rail has been closed, the switch track is shifted such that one of the cartridges designated for acceptable DIP devices is aligned by trackway 14. At step 218 stop arm 188, shown down in FIG. 14, is raised away from trackway 14 such that DIP devices can pass freely through the straightening station $S_{ST}$. At step 220 the former motor is started which in the preferred embodiment comprises a single motor mechanically connected to both former halfs 26 and 28. Starting and stopping the former motor results in the initiation or halting of the movement of elastomeric belts 146 which controls the flow of DIP devices through the former station.

The computer next at step 222 determines whether a part is present at the scanning station. As a DIP device passes through the scanning station, the number of leads are counted to determine whether a proper lead count appears on each DIP device. This DIP lead count is accomplished by counting the number of times leads intersect the infrared light passing through fiber optic 96 and orifice 156 of FIG. 11. If an improper number of leads is determined, the computer then goes to the reject sub-routine shown in FIG. 17 for rejection of the DIP device.

As the DIP device passes through the scanner station, calculations are made at step 226 for each lead in each row of the DIP device. These calculations are then compared to the maximum deviation for straightening, previously entered. If the calculated value exceeds the maximum deviation for straightening, the computer goes to the reject sub-routine shown in FIG. 17. If the calculated deviation is below the maximum deviation for straightening, the computer determines in step 230 whether the calculated value is above or below the maximum acceptable deviation. If the calculated value is above the maximum acceptable deviation, the computer goes to the straightener sub-routine which is detailed in FIG. 16 herein. If the calculated values fall below the maximum acceptable deviation, the computer continues to step 232 where it is determined whether a cartridge is present at the accept stations. A series of switches $A_S$, $R_S$ and $A_S$, respectively, are provided in the discharge station to transmit a signal to the computer if a cartridge ($C_A$, $C_R$, $C_{A'}$) is not present and aligned with the reject and accept parts of the track 14. The connection of these switches to computer 170 is known in the art and therefore, not shown in the drawing. If a switch indicates that a cartridge is not present, the computer goes to a stop routine, not shown in the drawings, whereby the computer stops all operation until cartridges are inserted in cartridge holder. If cartridges are present, the computer next determines whether a DIP device has passed through the output as determined by sensors 179, 181 and 183 providing signals on conductive leads 178, 180 and 182.

Figure 18:
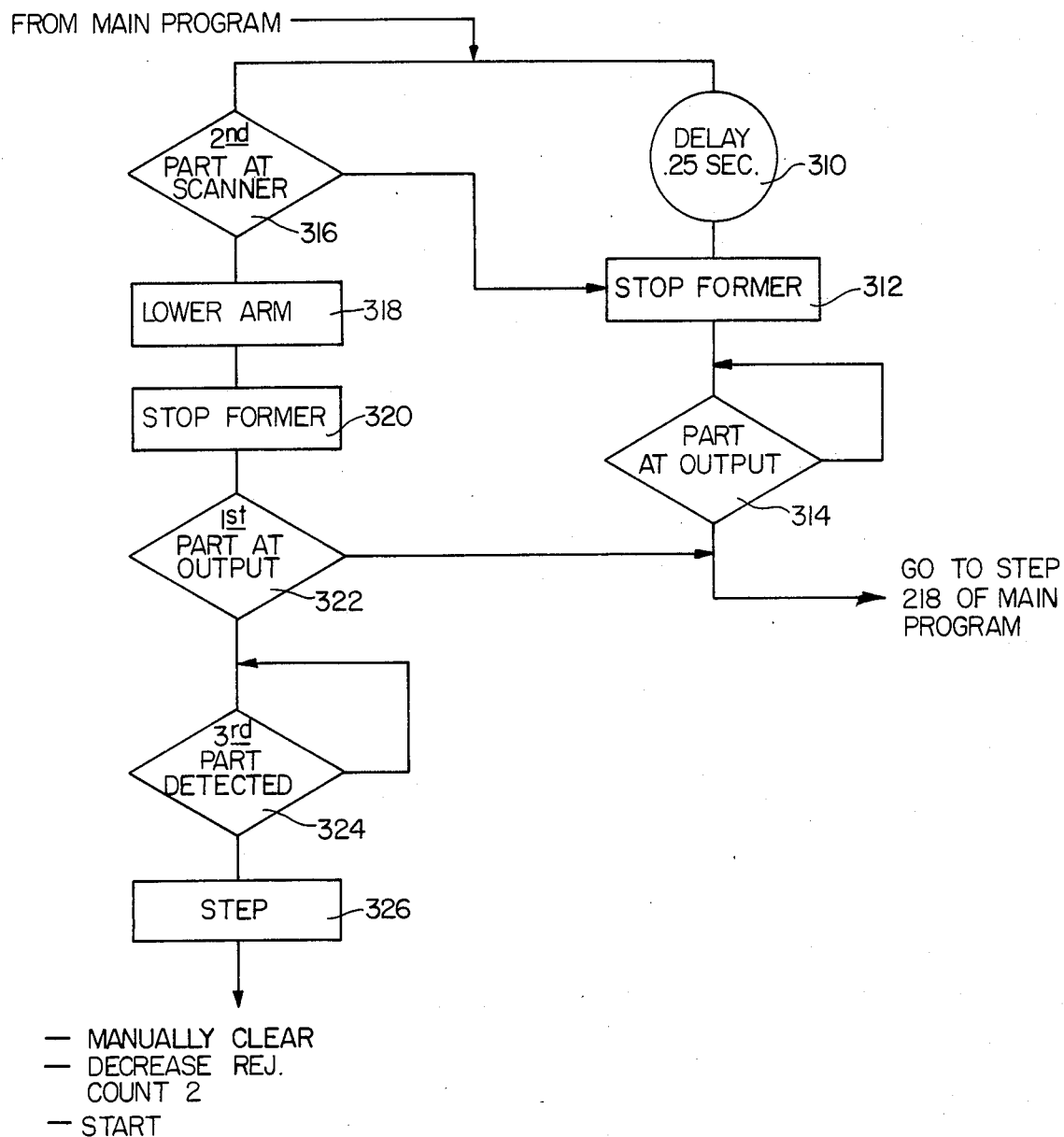
FIG. 18 is a flow chart of a sub-routine of the program shown in FIG. 15.

If the part does not pass this sensor within a prescribed period of time, for example, 25 milliseconds, the computer goes to the jam prevention routine which is shown on FIG. 18. If a passing DIP is sensed at the output, the computer returns to step 220 which provides for the cycling of the next DIP device from the former station $S_F$. The former station allows DIP devices to pass at a rate slow enough to allow the computer to determine the integrity of a DIP device and determine whether a staightening operation or rejection will occur.

Figure 16:
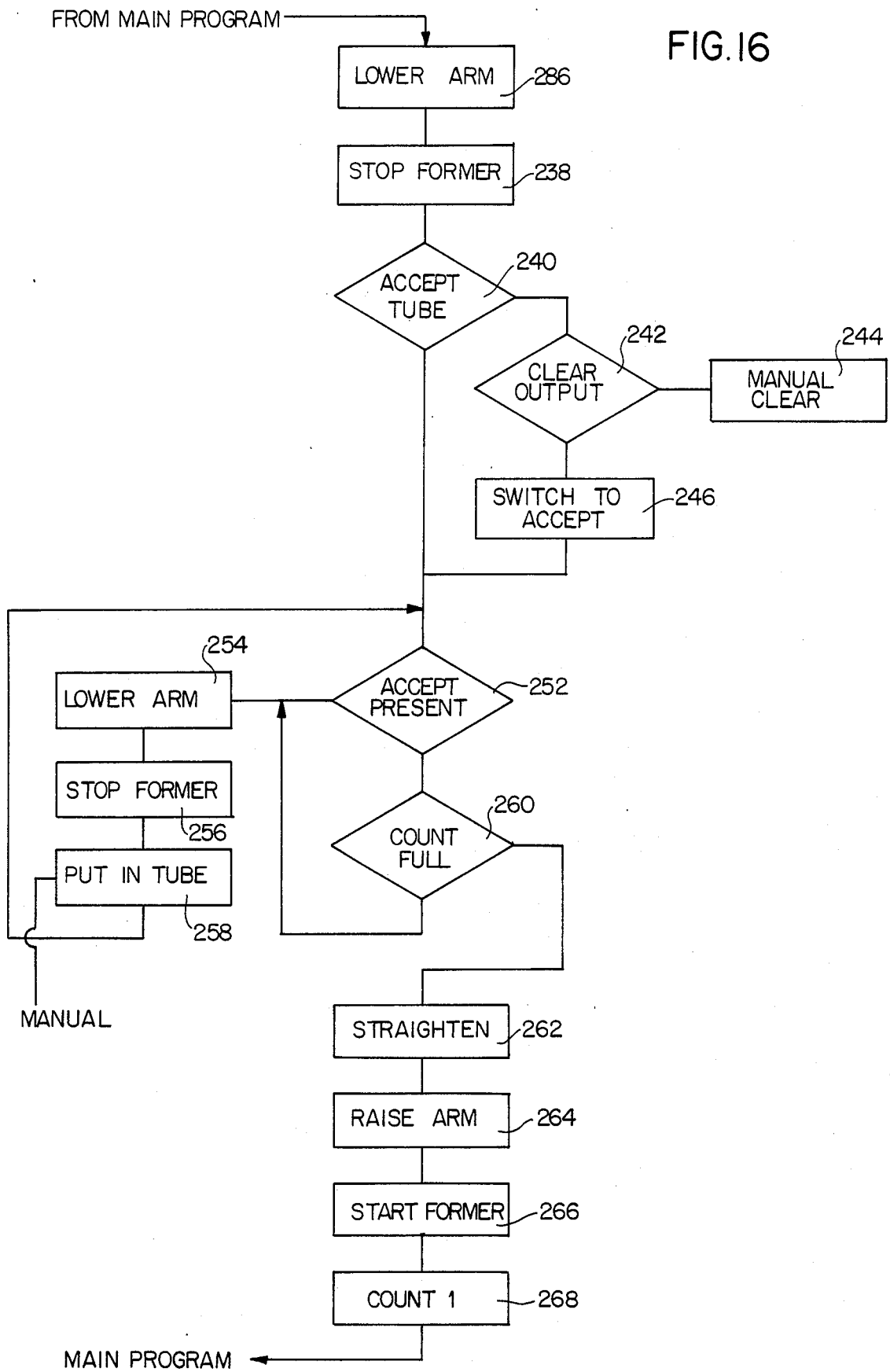
FIG. 16 is a flow chart of a sub-routine of the program shown in FIG. 15.

FIG. 16 dicloses the straightener sub-routine program which is used by the computer when a straightening operation is to take place. Once it has been determined a straightening operation is necessary, the computer lowers stop arm 188 at step 236. As the stop arm is lowered, the former motor is also stopped at step 238. Having lowered the stop arm and stopped the former motor, the computer now determines whether the switch track 58 is in an accept alignment. If the switch track is not in an accept alignment, the computer first determines whether the output is clear at step 242. If the output is not clear, the computer waits until the output has been manually cleared at step 244. If the output is clear, the computer switches to one of the accept tracks in switch track 58 at step 246. If it is determined that switch track 58 is in an accept alignment, the computer again determines whether the output sensors are clear in step 248. The computer next determines in step 252 whether an accept tube is present by sensing the output of switches ($C_A$ or $C_{A'}$). If an accept tube is not present, the computer lowers stop arm 188 in step 254, stops the former motor in 256 and awaits the manual insertion of a cartridge in step 258. If the computer determines in step 252 that an accept tube is present, the computer next determines whether the accept tube is full at step 260. It will be recalled from the discussion of FIG. 3 that the number of DIP devices per tube was entered. As DIP devices pass over the output sensors for the various tubes, which signals are transmitted to the computer on lines 178, 180 and 182, the computer counts the number of DIP devices to determine when the cartridges are full.

If the cartridges are full, the computer returns to step 254 through 258 which allows the manual insertion of a cartridge. If the count is not full, the computer next passes to step 262 wherein the straightening device straightens the DIP leads. The stop arm 188 is raised in step 264 and the former motor is started in step 266. In step 268, the computer counts one more acceptable DIP device.

Figure 17:
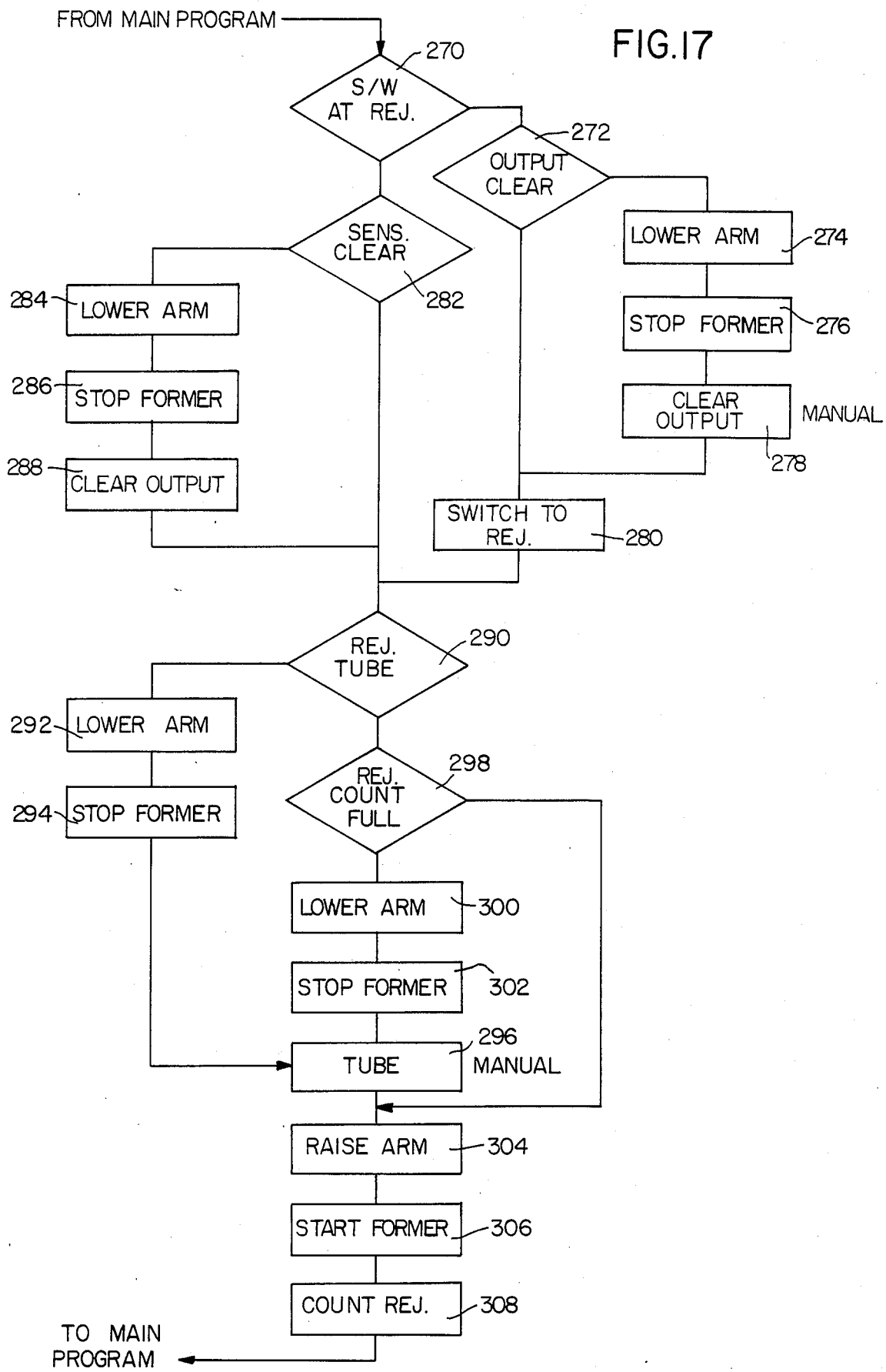
FIG. 17 is a flow chart of a sub-routine of the program shown in FIG. 15.

FIG. 17 discloses the reject sub-routine where in step 270 the computer first determines whether switch track 58 is in a reject alignment. If switch track 58 is not in such an alignment, the computer at step 272 first determines whether the output of the apparatus is clear. If the output of the apparatus is not clear, the computer lowers the stop arm, stops the former and allows the manual clearing of the output at steps 274 through 278 respectively. If the output of the apparatus is clear, the computer continues to step 280 wherein the switch track 58 is switched to a reject alignment. If it is determined that switch track 58 is already at reject alignment, the computer determines at step 282 whether the output sensor is clear. If the output sensor is not clear, the computer lowers stop arm 188, stops the former motor and allows for the manual clearing of the output at steps 284 through 288 respectively. If the output sensor at step 282 is determined to be clear, or after completion of steps 280 or 288, the computer determines at step 290 whether a reject cartridge is present in switch track 58. If a reject cartridge is not present, the computer lowers stop arm 188 and stops the former motor at steps 292 and 294 until a cartridge can be manually inserted in the switch track 58 at step 296. If at step 290 the computer determines that a reject cartridge is present in switch track 58, the computer next determines whether the reject count is full at step 298. If the reject count is full, the computer lowers stop arm 188 and stops the former motor at steps 300 and 302 respectively. Thereafter the computer waits at step 296 until a reject cartridge can be presented to switch track 58. If at step 298 the reject count is not determined to be full, the computer at step 304 raises stop arm 188, starts the former motor at step 306 and counts one rejected DIP device at step 308. The computer thereafter returns to the main program.

A jam prevention sub-routine is shown on FIG. 18. In the jam prevention routine, the computer is involved in some simultaneous programming. For example, at step 310 the computer pauses for a 0.25 second delay before stopping the former motor at step 312. After passing through step 312 the computer determines whether a part is at the output sensor. Once it has been determined that a part is at the output sensor, the computer goes back to step 218 of the main program. Simultaneously with steps 310, 312 and 314, the computer at step 316 determines whether a second part has reached the scanner. If a second part has not reached the scanner, the computer moves to step 312 and stops the former motor. If a second part has been located at the scanner, the computer lowers stop arm 188 and stops the former motor at 318 and 320 respectively. After stopping the former motor, the computer determines at step 322 whether the first part is at the output. If the first part is not at the output, the computer returns to step 218 of the main program. If the first part has passed the output, the computer determines in step 324 whether a third part has been detected at the scanner heads. Once the third part has been detected at the scanner heads, the computer stops at step 326. A jam is thus prevented from occurring in the apparatus. Consequently, the computer can only be restarted after the trackway has been manually cleared, the rejection count is decreased manually by two and the start switch is depressed.

Figure 19:
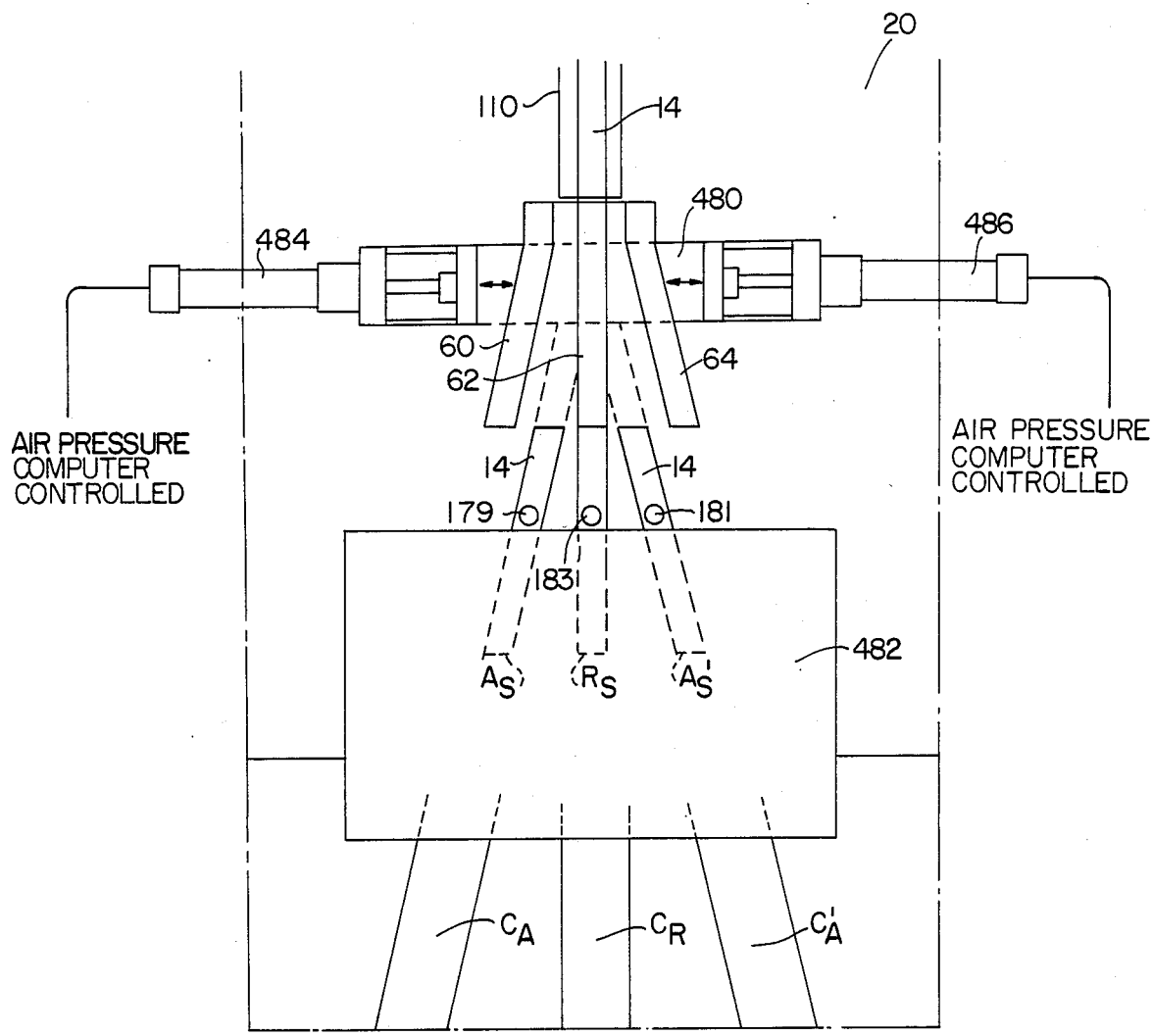
FIG. 19 is a fragmentary, schematic plan view of the three positionable shift track mechanism, partially shown at the bottom of FIG. 2.

A detailed showing of the shift track structure and operation is presented in FIG. 19. The shift track mechanism comprises a slidable guide mounted carriage member 480. On the upper surface of member 480 there are affixed, in spaced relationship, three separate DIP guide segments, of which 60 is divergent to the left, 62 which runs vertically, or straight, and 64 which is divergent to the right.

The carriage member 480, in a normal home position has centrally mounted track segment 62 axially aligned with the track 14, such that a DIP, which has been rejected, is allowed to run down trackway 14 and into the central collecting empty cartridge $C_R$ that is operatively mounted in cartridge holder 482.

The carriage member 480 is displaceable to the left or right of the trackway 14, thereby aligning the divergent track segments 60 or 64 with trackway 14 by means of two air operated cylinders 484, 486.

If a DIP is to be accepted, as determined by the scanning computer device, cylinder 484 is activated and segmental track 60 is aligned with track 14. The DIP is then diverted to the left, counted and enters into the cartridge $C_A$.

Similarly, if a DIP is to be straightened, as determined by the computer, cylinder 486 is activiated and track 64 is aligned with track 14. The cap is then diverted into cartridge container $C_{A'}$ and counted.

While specific and particular configurations and constructions are shown in the drawings, minor variations therein will be obvious to those skilled in the art without departing from the spirit of the invention. Such obvious changes or modifications are considered to be within the scope of the inventive concept as expressed herein, and as claimed hereinafter.

We claim:

1. In an apparatus for determining lead integrity of DIP devices, wherein the leads of said DIP devices extend from a track for supporting said DIP devices during passage through said apparatus, the improvement comprising:

transmitting means for the transmission of a signal, positioned so that the leads of said DIP devices traveling on said track intersect the transmitted signals;

receiving means for receiving and converting a transmitted signal to an electrical signal, positioned so that as said leads of said DIP device intersect said transmitted signal, said receiving means generates an electrical signal reflective of said intersection for determining the integrity of said leads based upon said electrical signal, said receiving means including receptors positioned on either side of said track such that each receptor receives said transmitted signal intersected by said leads as said DIP devices travel on said track, said receptors being arranged wherein a first receptor is oriented upstream along said track and wherein at least two other receptors are oriented such that one is further than the other from said track in order to receive signals which intersect the leads at at least two spaced points therein and both other receptors are downstream in the direction of travel of said DIP devices.

2. The apparatus of claim 1, wherein said receiving means comprises two sets of receptors, three receptors per set, each of said set of receptors being positioned on either side of said track such that each receptor receives said transmitted signal intersected by said leads as said DIP devices travel on said track and conversion means connected to said receptors for converting the signal received by said receptors to an electrical signal.

3. The apparatus of claim 1, wherein said transmitting means transmits said signal along a path from a transmitter off of at least one reflective surface prior to passing across said leads.

4. The apparatus of claim 3, wherein said path includes two reflective surfaces.

5. The apparatus of claim 1, wherein said transmitting means is recessed within a housing.

6. The apparatus of claim 5, wherein the transmitting means is recessed approximately 1⅞ to 2 inches in said housing.

7. The apparatus of claim 1, wherein said transmitting means comprises infrared light transmitters and wherein said receiving means comprises fiber optic tubes having one end disposed to receive said infrared light and having said other end disposed proximate a phototransducer capable of converting said infrared light to an electrical signal.

8. The apparatus of claim 7, wherein said transmitters, fiber optics and phototransducers are disposed in two housings positioned on either side of said track, said housings having a groove formed in one end thereof, said groove positioned such that as such DIP devices travel on said track, leads thereof pass through said grooves, and said transmitters and the fiber optics arranged so that said infrared light is transmitted across said groove, whereby as said leads pass through said groove, the infrared light transmitted across said groove is intersected.

9. The apparatus of claim 8, wherein said transmitting means transmits said signal along a path from a transmitter off of at least one reflective surface prior to passing across said leads.

10. The apparatus of claim 9, wherein said path includes two reflective surfaces.

11. The apparatus of claim 8, wherein said transmitters are recessed in bores in said housings.

12. The apparatus of claim 11, wherein said transmitters are recessed approximately 1⅞ to 2 inches in said housing.

13. The apparatus of claim 11, wherein said bores define a path for said light from said transmitters off of at least one signal direction changing reflective surface prior to passing across said groove.

14. The apparatus of claim 12, wherein said path includes two reflective surfaces.

15. An apparatus for determining lead integrity of DIP devices, comprising:

a track for supporting said DIP devices during passage through said apparatus;

transmitting means for the transmission of a signal, positioned so that the leads of said DIP devices traveling on said track intersect the transmitted signals;

receiving means for receiving and converting a transmitted signal to an electrical signal, positioned so that as said leads of said DIP device intersect said transmitted signal, said receiving means generates an electrical signal reflective of said intersection, said receiving means comprising receptors positioned on either side of said track such that each receptor receives said transmitted signal intersected by said leads as said DIP devices travel on said track, said receptors being arranged in a right triangular pattern wherein the base of said triangle is oriented substantially parallel to said track and wherein the side of said triangle is oriented substantially perpendicular to said track and lies downstream in the direction of travel of said DIP devices and wherein the receptor positioned at the point of intersection of the side and hypotenuse of said triangle is located perpendicularly further from said track than the base of said triangle, and computer means connected to receive said electrical signal, for determining the integrity of said leads based upon said electrical signal.

16. The apparatus of claim 15, wherein the length of the base of said triangle is one-fourth the distance between said leads of said DIP devices.

17. The apparatus of claim 16, wherein said computer means determines the integrity of said leads according to the formula $$\text{Integrity} = \frac{\frac{(X \cdot T_1) - T_2}{(X \cdot T_1)} \cdot D_1}{D_3} \cdot D_4$$

wherein $D_1$=the length of said base of said triangle; $D_3$=the length of said side of said triangle; $D_4$=the length of said lead; $T_1$=time for a lead to pass between receptor's position on the base of said triangle; $T_2$=the time for leads to pass between the upstream receptor and the receptor located at the intersection of said side and said hypotenuse of said triangle; and $X$=the percent difference between $D_1$ and $D_2$; and $D_2$=the distance from the receptor, positioned at said intersection of the side and hypotenuse of said triangle, along a line parallel to said base to an axis which passes through the receptor, positioned at the intersection of the base and hypotenuse of said triangle, and which axis is perpendicular to said base.

18. A method for determining lead integrity of DIP devices, comprising the steps of:
   providing DIP devices to a trackway for travel thereon;
   transmitting a signal adjacent said trackway such that the leads of DIP devices travelling on said trackway intersect said transmitted signal;
   receiving said transmitted signal such that the intersection of leads with the transmitted signal is reflected in the reception thereof; said receiving being accomplished by receptors arranged wherein a first receptor is upstream along said trackway and wherein at least two other receptors are oriented such that one is further than the other from said trackway in order to receive signals which intersect the leads at at least two spaced points thereon and both other receptors are downstream in the direction of travel of said DIP devices;
   converting the received signal into an electrical signal; and
   determining the integrity of leads based upon said electrical signal.

19. The method of claim 18, further comprising the step of calibrating the determination of lead integrity, said calibration comprising the steps of:
   passing a DIP device having known lead deviations along the trackway; and
   correcting the determination of the integrity of the leads based upon said electrical signal until said known lead deviations are determined.

20. The method of claim 18, wherein the step of receiving said transmitted signal is accomplished by using a receiving means comprising two sets of receptors, three receptor per set, each of said set of receptors being positioned on either side of said trackway such that each receptors receives said transmitted signal intersected by the leads of said devices traveling on said trackway.

21. A method for determining lead integrity of DIP devices, comprising the steps of:
   providing DIP devices to a trackway for travel thereon;
   transmitting a signal adjacent said trackway such that the leads of DIP devices travelling on said trackway intersect said transmitted signal;
   receiving said transmitted signal such that the intersection of leads with the transmitted signal is reflected in the reception thereof; said receiving being accomplished by receptors arranged in a right triangular pattern wherein the base of said triangle is oriented substantially parallel to said trackway and wherein the side of said triangle is oriented substantially perpendicular to said trackway and lies downstream in the direction of travel of said DIP devices and wherein the receptor positioned at the point of intersection of the side and hypotenuse of said triangle is located perpendicularly further from said trackway than the base of said triangle;
   converting the received signal into an electrical signal; and
   determining the integrity of leads based upon said electrical signal.

22. The method of claim 21, further comprising the step of calibrating the determination of lead integrity, said calibration comprising the step of:
   passing a DIP device having known lead deviations along the trackway; and
   correcting the determination of the integrity of the leads based upon said electronic signal by adjusting the values of $D_1$, $D_2$, and $D_3$.

23. An apparatus for determining lead integrity of DIP devices comprising:
   a track for supporting said DIP devices during passage through said apparatus;
   transmission means for transmitting a signal positioned so that the leads of said DIP device travelling on said track intersect the transmitted signal;
   receiving means for receiving and converting said transmitted signal to an electrical signal, positioned so that as leads of said DIP device intersect said transmitted signal, said receiving means generates an electrical signal reflective of said intersection for determining the integrity of said leads based upon said electrical signal; and
   said transmitting means being recessed within a housing and positioned below said track for transmitting said signal along a path up from a transmitter off of at least one reflective surface and thereafter passing across said leads to said receiving means.

24. The apparatus of claim 23, wherein said receiving means includes a first receptor oriented upstream along said track and wherein at least two other receptors are oriented such that one is further than the other from said track and both receptors are downstream in the direction of travel of said DIP devices.

25. The apparatus of claim 23, wherein said receiving means comprising receptors positioned on either side of said track such that each receptor receives said transmitted signal intersected by said leads as said DIP devices travel on said track, said receptors being arranged in a right triangular pattern wherein the base of said triangle is oriented substantially parallel to said track and wherein the side of said triangle is oriented substantially perpendicular to said track and lies downstream in the direction of travel of said DIP devices and wherein the receptor positioned at the point of intersection of the side and hypotenuse of said triangle is located perpendicularly further from said track than the base of said triangle.

26. The apparatus of claim 23, wherein said path includes two reflective surfaces.

* * * * *